US012805359B2

(12) United States Patent
Bechert et al.

(10) Patent No.: US 12,805,359 B2
(45) Date of Patent: Nov. 17, 2026

(54) CHIP ARRANGEMENT

(71) Applicant: Infineon Technologies AG, Neubiberg (DE)

(72) Inventors: Hermann Bechert, Neustadt A.d. Danau (DE); Andreas Beer, Regensburg (DE); Frank Püschner, Kelheim (DE)

(73) Assignee: Infineon Technologies AG, Neubiberg (DE)

( * ) Notice: Subject to any disclaimer, the term of this patent is extended or adjusted under 35 U.S.C. 154(b) by 542 days.

(21) Appl. No.: 18/303,177

(22) Filed: Apr. 19, 2023

(65) Prior Publication Data

US 2023/0361076 A1 Nov. 9, 2023

(30) Foreign Application Priority Data

May 3, 2022 (DE) ......................... 102022110838.4

(51) Int. Cl.

| | |
|---|---|
| ***H10W 70/66*** | (2026.01) |
| *H10W 72/00* | (2026.01) |
| *H10W 72/30* | (2026.01) |
| *H10W 90/00* | (2026.01) |

(52) U.S. Cl.

CPC ...... *H10W 70/66* (2026.01); *H10W 72/07331* (2026.01); *H10W 72/07332* (2026.01); *H10W 72/07336* (2026.01); *H10W 72/07338* (2026.01); *H10W 72/074* (2026.01); *H10W 72/325* (2026.01); *H10W 72/352* (2026.01); *H10W 72/354* (2026.01); *H10W 90/734* (2026.01)

(58) Field of Classification Search

CPC ... H01L 24/83; H01L 24/32; H01L 23/49866; H10W 70/66; H10W 72/073; H10W 72/07331; H10W 72/07332

See application file for complete search history.

(56) References Cited

U.S. PATENT DOCUMENTS

| | | | | |
|---|---|---|---|---|
| 6,498,051 | B1 * | 12/2002 | Watanabe | H05K 3/323 438/106 |
| 9,670,385 | B2 * | 6/2017 | Namiki | C08K 3/22 |
| 2009/0229123 | A1 * | 9/2009 | Sakai | H01L 24/83 29/854 |

FOREIGN PATENT DOCUMENTS

| | | |
|---|---|---|
| JP | 2017203109 A | 11/2017 |

OTHER PUBLICATIONS

Oct. 27, 2022 (DE) Office Action—App. 102022110838.4.
Feb. 7, 2023 (DE) Office Action—App. 102022110838.4.

* cited by examiner

*Primary Examiner* — Dale E Page
*Assistant Examiner* — Wilner Jean Baptiste
(74) *Attorney, Agent, or Firm* — Banner & Witcoff, Ltd.

(57) ABSTRACT

A chip arrangement including a carrier, a chip having at least one chip pad, and a bonding agent to fasten the chip pad on the carrier, the bonding agent having solder material and an anisotropic conductive adhesive.

8 Claims, 6 Drawing Sheets

CHIP ARRANGEMENT

TECHNICAL FIELD

The disclosure relates to a chip arrangement, to a method for producing a chip arrangement, to a chip card and to a method for producing a chip card.

BACKGROUND

In order to produce a chip arrangement that has a chip applied on a carrier, it may be necessary to connect at least one chip pad (typically a plurality of chip pads), which is or are part of the chip (for example of a redistribution layer (RDL)), electrically and mechanically to the carrier, for example to a metal structure of the carrier.

Soldering by means of solder balls is difficult in particular when a suitable flux is not used and there is no solder stop mask on the carrier because conventional fluxes and solder stop masks are incompatible with parts of the carrier (for example a carrier tape, also referred to as an FCOS tape) or other production processes or materials (for example they would react with bonding agents).

Without a solder stop mask and without a flux, however, the solder material is liable to flow away from the connecting region along the metal lines.

A corresponding example of a chip arrangement 100 of the prior art is represented in FIG. 1A.

The chip 102 with the chip pad 108 is applied by means of the solder material 110 on the carrier 104, 104C, 106, which comprises the metal structure 104, 104C. A base metal 104 of the metal structure 104, 104C, for example copper, may be provided with a coating 104C, for example a nickel, gold or palladium coating or a combination thereof, for example a mechanically stabilizing nickel coating and a gold or palladium coating for the visual appearance.

It can be seen in FIG. 1A that the solder material 110 has flowed away from the contact region between the chip pad 108 and the metal structure 104, 104C along the surface of the metal structure 104, 104C, and in the right part of FIG. 1A even along a side wall of the metal structure 104, 104C. Because of the lack of solder material 110 in the contact region, a cavity 116 which degrades the electrical conductivity in the contact region has been formed there.

Another method known in the prior art for applying the chip pad 108 on the carrier 104, 104C, 106 uses an anisotropic conductive adhesive (ACA).

A chip arrangement 101 which was produced by using such an anisotropic conductive adhesive 112 is represented by way of example in FIG. 1B.

When applying the chip 102 with the chip pad 108, the aim is to compress the anisotropic conductive adhesive 112 that is located between the chip pad 108 and the carrier 104, 104C, 106 so that electrically conductive particles 112P embedded in the electrically insulating bonding material 112A establish an electrically conductive contact between the chip pad 108 and the metal structure 104, 104C of the carrier 104, 104C, 106.

This connecting method is disadvantageous particularly in the context of a plurality of chip pads 108. This is because even though tolerances for deviations in the vertical position of the respective surfaces of the plurality of chip pads 108 (or the surfaces of the associated metal structures 104, 104C) with respect to one another are strict (for example about +/−0.5 μm), it may happen that in one of the contact regions the chip pad 108 is already pressed directly onto the electrically conductive particles 112P, and the latter are pressed onto the metal structure 104, 104C, but in other contact regions this is not yet the case, that is to say no electrical contact is yet established.

Expressed another way, height or positioning inaccuracies of the chip pads 108 and/or of the metal structure 104, 104C lead to the risk of electrical malfunctions being increased.

The problems explained above are not easy to resolve by means of the prior art, because:

1) Anisotropic conductive adhesives are limited in their ability to compensate for different heights of the chip pads 108, or of the associated metal structures 104, 104C. In particular, beyond a number of three or more chip pad/metal structure contact regions, the likelihood that one of the contacts will be defective owing to a minimally tilted chip 102 increases.
2) Standard soldering methods with solder balls are designed with a view to good wettability of the solder surfaces being achieved by a chemically aggressive flux and the solder material being prevented from flowing away by a solder stop mask. However, the flux typically degrades a bonding agent that is used for mechanical fastening of the chip 102 and a solder stop mask would increase the costs.
3) Particularly for chip card applications that use the chip arrangement, it is not sufficient to provide just a solder connection without an additional bonding agent because high mechanical reliability and stability are required and there are only a few contact regions.

SUMMARY

In various exemplary embodiments, a chip arrangement is provided in which the fastening of a chip on a carrier and the conductivity of an electrically conductive connection between the chip and the carrier have a high reliability.

In various exemplary embodiments, the connection between the chip and the carrier comprises a solder material and an anisotropic conductive adhesive (ACA).

The solder material, which may for example be provided as a solder ball, can form an electrically conductive connection with any conventional chip pad material and can be prevented from flowing out of the connecting region by the anisotropic conductive adhesive, in particular the particles therein (for example nickel particles).

BRIEF DESCRIPTION OF THE DRAWINGS

Exemplary embodiments of the disclosure are represented in the figures and will be explained in more detail below.

DETAILED DESCRIPTION

Figure 1A:
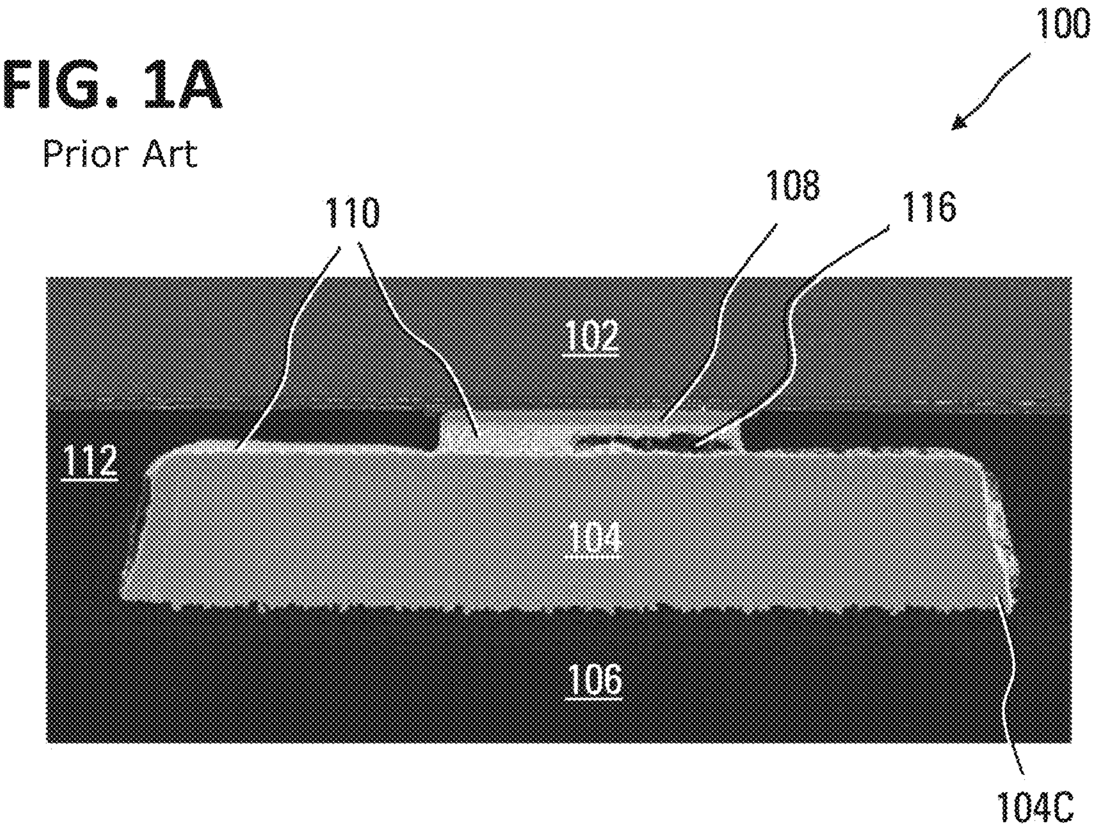
FIG. 1A Prior Art
FIG. 1A shows a cross-sectional view of a chip arrangement according to a prior art.

In the following detailed description, reference is made to the appended drawings, which form part of this description and in which specific embodiments, in which the subject matter of the disclosure may be carried out, are shown for illustration. In this regard, direction terminology such as "up", "down", "forward", "backward", "front", "rear", etc. is used with reference to the orientation of the figure or figures being described. Since components of exemplary embodiments may be positioned in a number of different orientations, the direction terminology is used for illustration and is in no way restrictive. It is to be understood that other exemplary embodiments may be used and structural or logical changes may be carried out, without departing from the protective scope of the present disclosure. It is to be understood that the features of the various exemplary embodiments described herein may be combined with one another unless otherwise specifically indicated. The following detailed description is therefore not to be interpreted in a restrictive sense, and the protective scope of the present invention is defined by the appended claims.

In the scope of this description, the terms "connected", "attached" and "coupled" are used to describe both direct and indirect connection, direct or indirect attachment and direct or indirect coupling. In the figures, elements which are identical or similar are provided with identical references insofar as this is useful.

In various exemplary embodiments, a chip arrangement is provided which, for connecting a chip to a carrier, uses a bonding agent that comprises both an anisotropic conductive adhesive (or an anisotropic conductive bonding agent) and a solder material.

At first sight, it seems illogical to use both a solder material and an anisotropic conductive adhesive because, in principle, both the conductive adhesive and the solder material on their own would be suitable for producing an electrically conductive bonding connection.

However, tests have shown that the combination of the anisotropic conductive adhesive with the solder material has several advantages:

1) The electrically conductive and mechanically robust connection can be produced on almost any conventional chip pad material and almost any conventional carrier metal structure material (including for example on Miralloy®).
2) No flux is needed for producing the connection.
3) Flow of solder material away can be reduced or prevented. According to experiments, the retention of the solder material may possibly be attributed primarily to the electrically conductive particles in the anisotropic conductive adhesive. The conductive particles may, for example, comprise nickel. Because the anisotropic conductive adhesive prevents the solder material from flowing away, a solder stop mask can be obviated and it is possible to increase the process window for curing the adhesive, for example a temperature range, a processing time, an application pressure and the like.
4) In general, an application pressure may be reduced compared with a bonding agent that comprises only the anisotropic conductive adhesive (and likewise in comparison with a connecting by means of contact bumps and nonconductive adhesive, which is suitable only for some chip geometries anyway). The reduced application pressure can mean that damage due to a locally excessive application pressure and/or bulging of contact locations on the rear side are/is less likely.
5) With a suitable selection of the materials, the soldering and the curing of the anisotropic conductive adhesive can be carried out in a single step, for example by means of a device already optionally used at present for soldering or for curing, for example an FCOS curing station (FCOS stands for "Flip Chip on Substrate", and therefore for the chip being mounted the other way round, that is to say with its contact pads facing toward the carrier).

Figure 2:
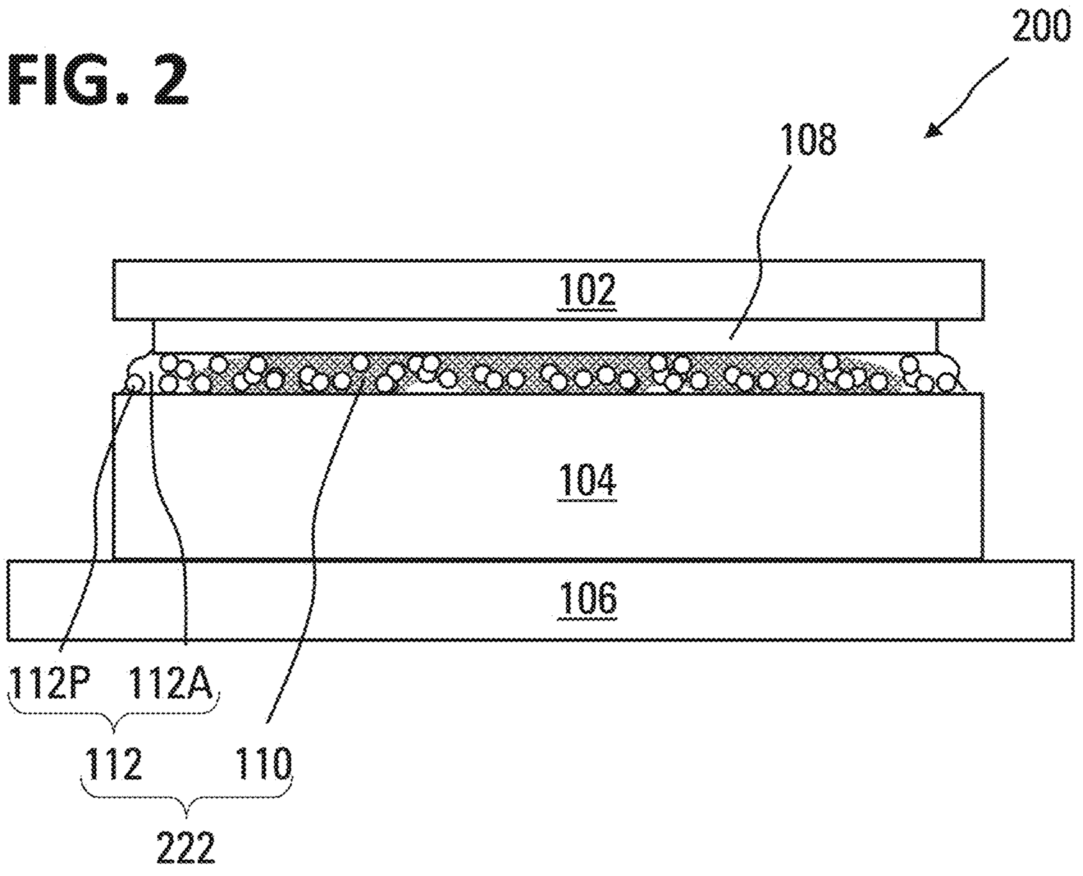
FIG. 2 shows a schematic cross-sectional view of a chip arrangement according to various exemplary embodiments.

FIG. 2 shows a chip arrangement 200 according to various exemplary embodiments. The chip arrangement 200 comprises a carrier 104, (106) and a chip 102 having at least one chip pad 108. The chip pad 108 may, for example, be part of a redistribution layer (RDL).

The carrier 104 comprises a metal at least in a contact region in which an electrically conductive connection to the chip pad 108 of the chip 102 is produced, or is intended to be produced. The carrier 104 may itself provide a carrying or supporting function for the chip 102, or the carrier 104, 106 may comprise a (supporting) carrier 106 (which is for example nonconductive) in addition to the carrier 104 (which is at least partially made of metal and is therefore also sometimes referred to here as a metal structure 104).

In one exemplary application case, the carrier 104, 106 may comprise a carrier tape, for example consisting of a plastic, for example polyimide, as the supporting carrier 106 and may be the metal structure 104 of the carrier 104, 106, which may for example comprise gold, palladium, Miralloy® (a copper-tin or copper-tin-zinc alloy) or other metals or alloys typically used for contact areas on carriers 104, 106, possibly with a coating, for example a nickel layer 104C.

In one typical exemplary embodiment, the chip arrangement 200 may be a chip card module which is configured to be arranged in a chip card, for example for contact-based use of the chip card.

In such a case or other cases, the at least one chip pad 108 may comprise a multiplicity of chip pads (for example one chip pad 108 per active contact-based contact, for example at least four chip pads 108).

The at least one chip pad 108 may for example comprise gold, palladium, Miralloy® or other metals or alloys typically used for chip pads 108.

The chip arrangement 200 may furthermore comprise a bonding agent 222 for fastening the chip pad 108 on the carrier 104, 106.

In various exemplary embodiments, the bonding agent 222 may comprise solder material 110 and an anisotropic conductive adhesive 112.

The anisotropic conductive adhesive 112 may comprise a bonding material 112A and electrically conductive particles 112P embedded therein, for example nickel particles or particles of another conductive material, for example another metal. The electrically conductive particles 112P may typically have diameters in a range of about 5 μm to about 10 μm.

In various exemplary embodiments, the anisotropic conductive adhesive may be configured to cure at a temperature in a range of about 140° C. to about 170° C., for example by the temperature being maintained for several seconds, for example between 6 and 9 seconds.

The solder material 110 may be a solder material typically used for producing a solder connection between a chip pad 108 and a carrier 104, 106. For example, a bismuth-tin (SnBi) solder material may be used, for example with a composition of 42 percent by weight of tin and 58 percent by weight of bismuth.

The metal of the solder material 110 may be a metal different than that of the electrically conductive particles 112P of the anisotropic conductive adhesive 112.

With a combination of the solder material 110 described by way of example with the anisotropic conductive adhesive 112 described by way of example as the bonding agent 222, it is advantageous that the curing temperature of the anisotropic conductive adhesive 112 forms a range that comprises the melting temperature of the solder material 110. Accordingly, it is possible to carry out the soldering process and the curing process simultaneously as a joint process.

FIG. 3A to 3C and FIG. 4A to 4C respectively show an illustration of a method for producing a chip arrangement 200 according to various exemplary embodiments.

Figure 1B:
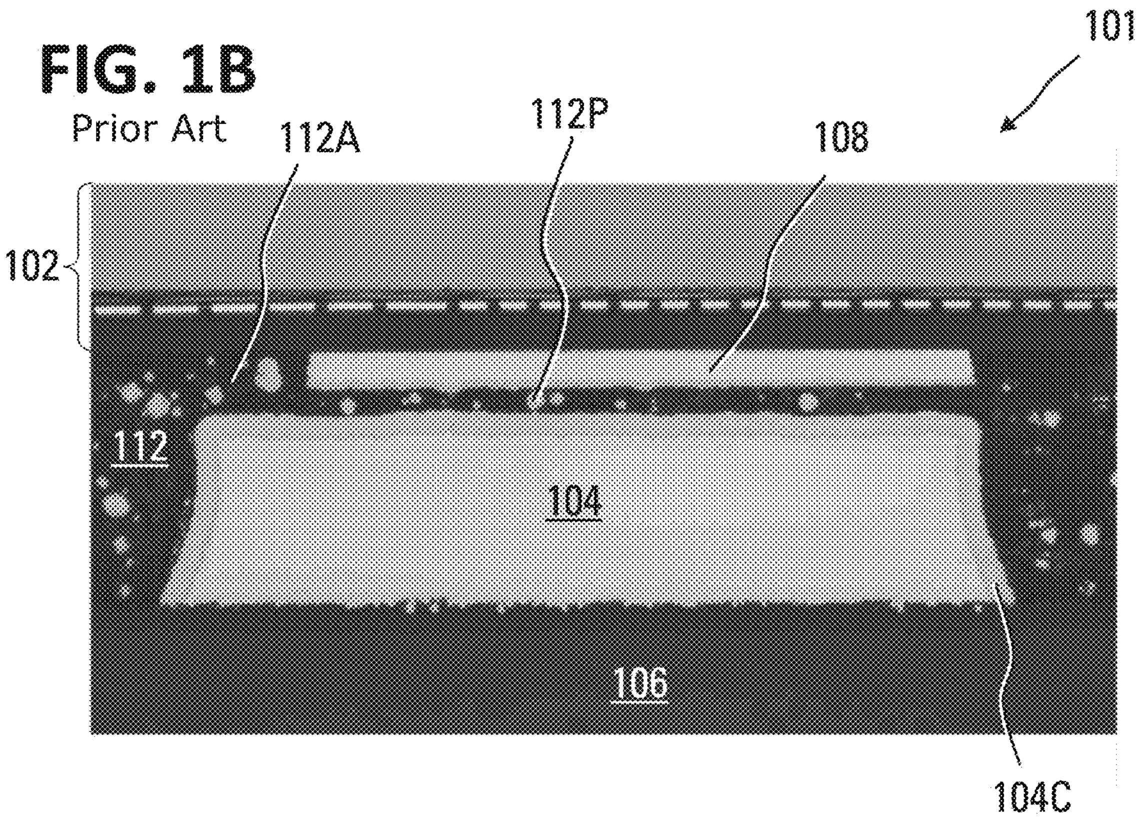
FIG. 1B Prior Art
FIG. 1B shows a cross-sectional view of a chip arrangement according to a prior art.

Structures represented in FIGS. 3A to 3C and 4A to 4C correspond partially to those of FIG. 1A to 2, so that repetition of the description may sometimes be omitted.

Figure 3A:
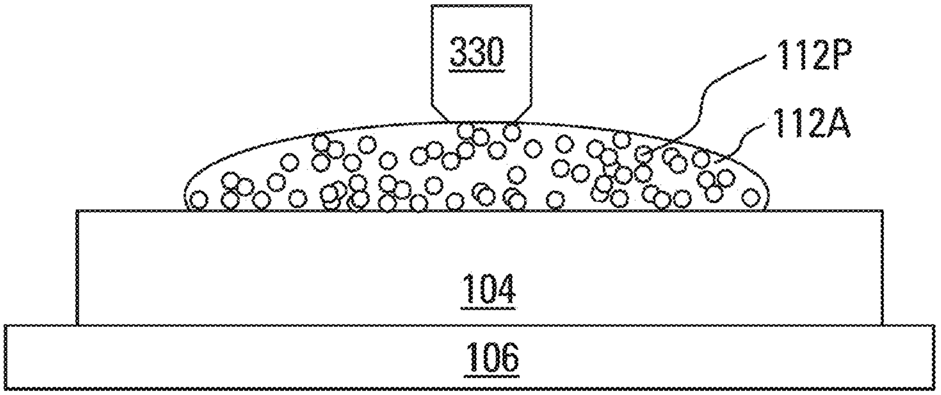
FIGS. 3A to 3C show an illustration of a method for producing a chip arrangement according to various exemplary embodiments.
Figure 3B:
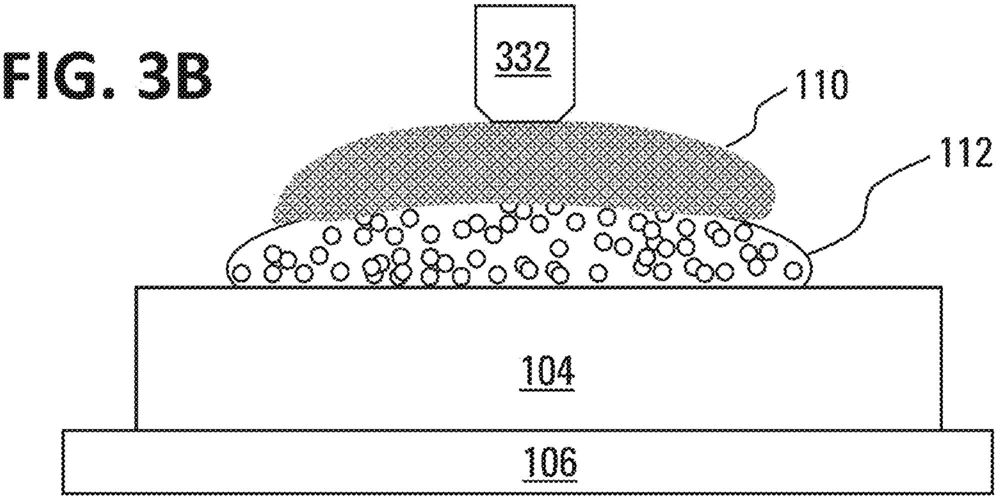
Figure 3C:
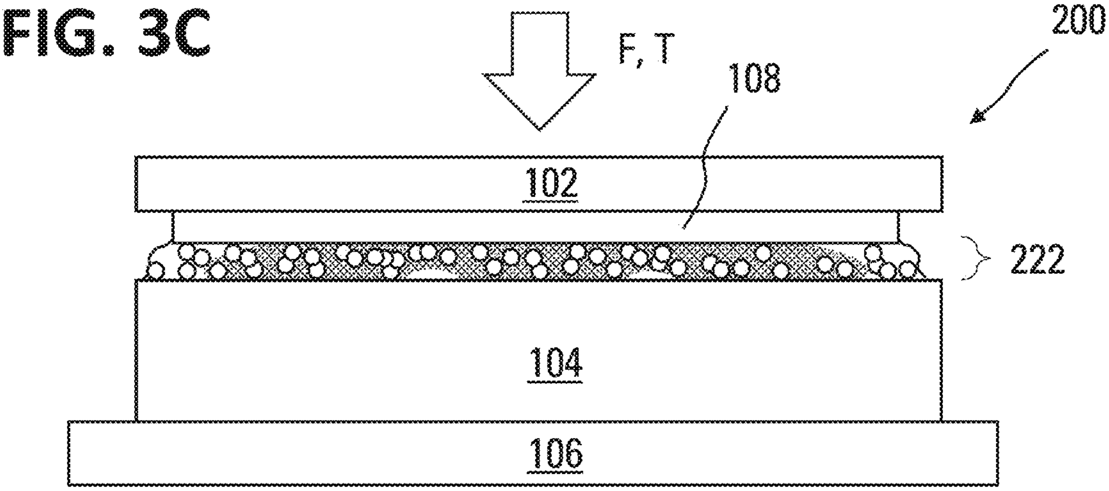
Figure 4A:
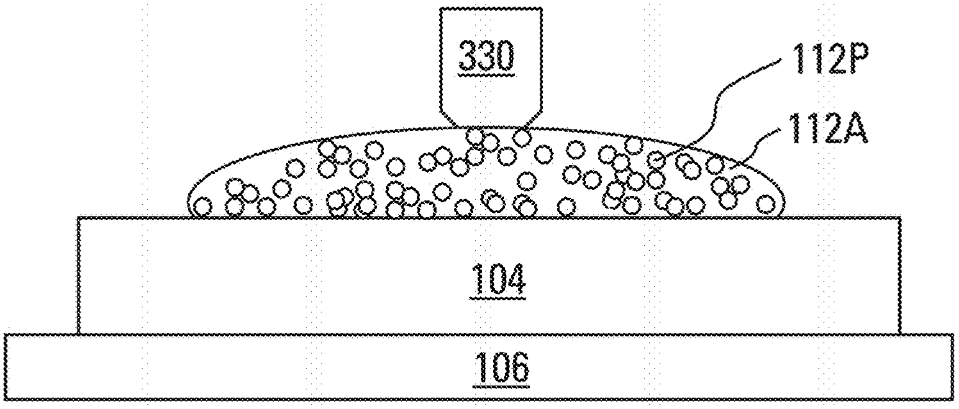
FIGS. 4A to 4C show an illustration of a method for producing a chip arrangement according to various exemplary embodiments.
Figure 4B:
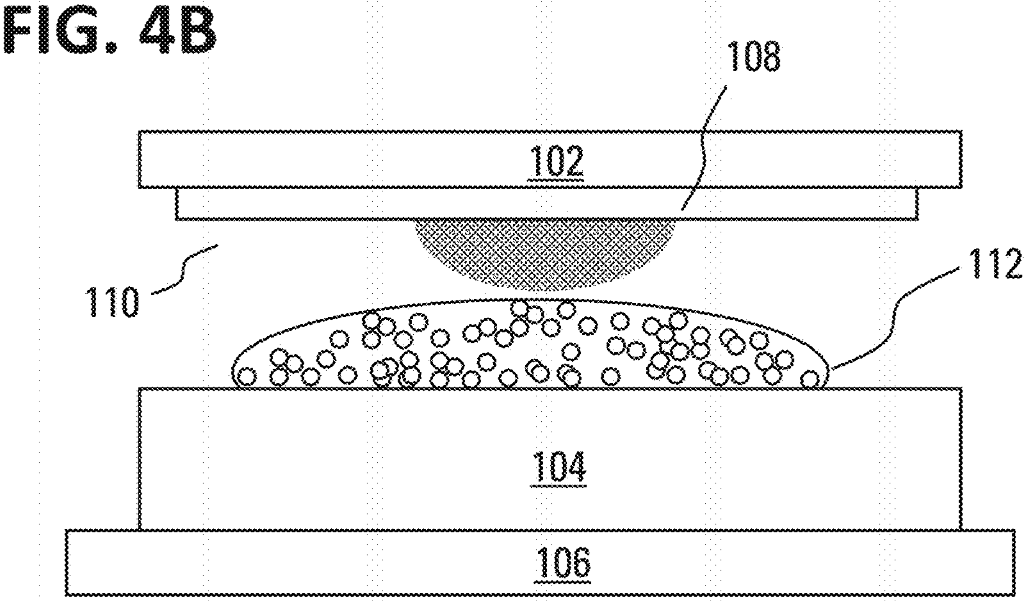
Figure 4C:
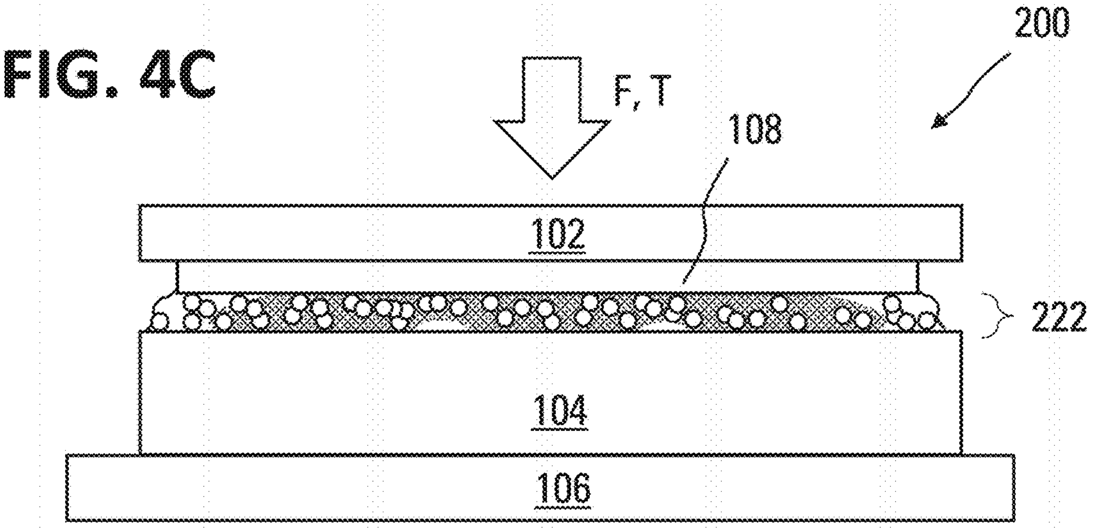

In the methods illustrated in FIG. 3A to 3C and in FIG. 4A to 4C, the anisotropic conductive adhesive 112 is initially applied on the carrier 104, 106. Although only one carrier segment, which corresponds to the chip pad 108, is represented in FIG. 3A to 3C and FIG. 4A to 4C, it is to be understood that the carrier 104, 106 is larger than as represented in the figures. For example, in particular the (supporting) carrier 106 may be so large that it comprises a plurality of metal structures 104 (for example electrically insulated from one another), one of which may respectively be applied on one of the multiplicity of chip pads 108.

In FIGS. 3A and 4A, it is represented that the anisotropic conductive adhesive 112 is applied on the carrier 104, 106 (in particular on the metal structure 104) in the liquid state by means of a dispenser 330.

In various exemplary embodiments, the anisotropic conductive adhesive 112 may be applied surface-wide on the entire carrier 104, 106, including a multiplicity of metal structures 104, for example likewise by means of a dispenser or by means of other methods, for example by means of printing, blade coating or other widely known methods. During the application, the anisotropic conductive adhesive 112 may for example be in the form of a paste.

The solder material 110 may subsequently be applied, for example onto the anisotropic conductive adhesive 112, for example as represented in FIG. 3B by means of a dispenser 332, which may be a different dispenser than the dispenser 330 or the same dispenser as for the dispensing of the anisotropic conductive adhesive 112, if it is suitable for this.

The arrangement of the solder material 110 is the essential difference between the method represented in FIG. 3A to 3C and the method represented in FIG. 4A to 4C. Specifically, as represented in FIG. 4B, the solder material 110 may be arranged on the chip pad 108 before the chip 102 is arranged over the carrier 104, 106.

For example, as represented in FIG. 4B, the solder 110 may be arranged on the chip pad 108 as a solder ball, or for example (not represented) as a solder material layer.

The arrangement of the solder material on the chip pad 108 may, for example, take place at the wafer level, that is to say before singulation of the chips 102.

As represented in FIGS. 3C and 4C, in order to connect the chip pad 108 to the carrier 104, 106, the solder material 110 may be liquefied by means of heating (represented as T) up to or beyond the melting point.

At the same time, the carrier 104, 106 and the chip 102 may be pressed against one another (represented as F).

The molten solder material 110 can displace the bonding agent 112A of the anisotropic conductive adhesive 112, which is still liquid at that time, at least partially (for example in the direction of the edge of the carrier 104, 106), at least partially encapsulate the electrically conductive particles 112P and/or become connected to them, and form an electrically conductive connection between the chip pad 108 and the electrically conductive carrier 104. With continued heating in a temperature range that is required for the curing of the anisotropic conductive adhesive 112, the anisotropic conductive adhesive 112 finally cures. During cooling, the solder material 110 hardens.

The carrier 104, 106 and the chip pad 108 are therefore connected to one another mechanically stably and electrically conductively, without a flux or a solder stop mask having been needed and without significant amounts of the solder 110 flowing away from the contact region.

Figure 5:
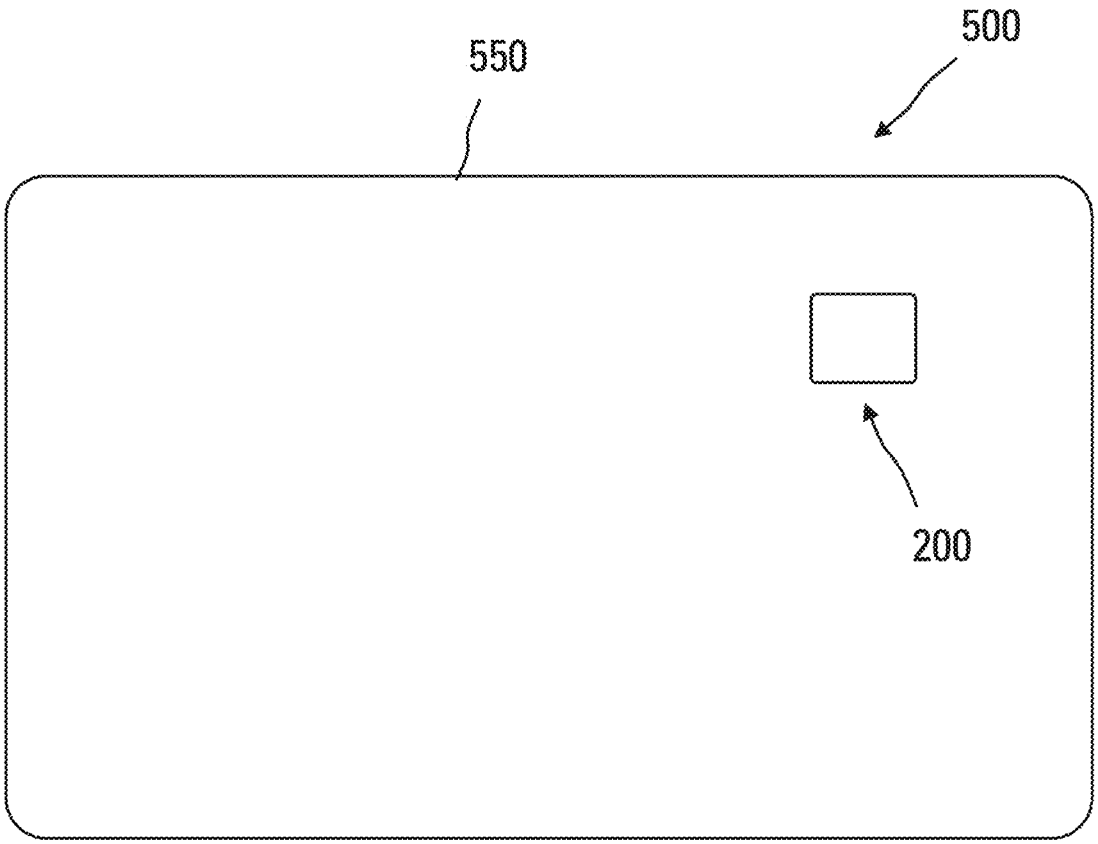
FIG. 5 shows a chip card according to various exemplary embodiments.

FIG. 5 is a chip card 500 according to various exemplary embodiments.

The chip card 500 comprises a chip card body 550 and a chip arrangement 200 according to various exemplary embodiments, for example as described above, for example in connection with FIG. 2 and/or with FIG. 3A to 3C and/or FIG. 4A to 4C.

Figure 6:
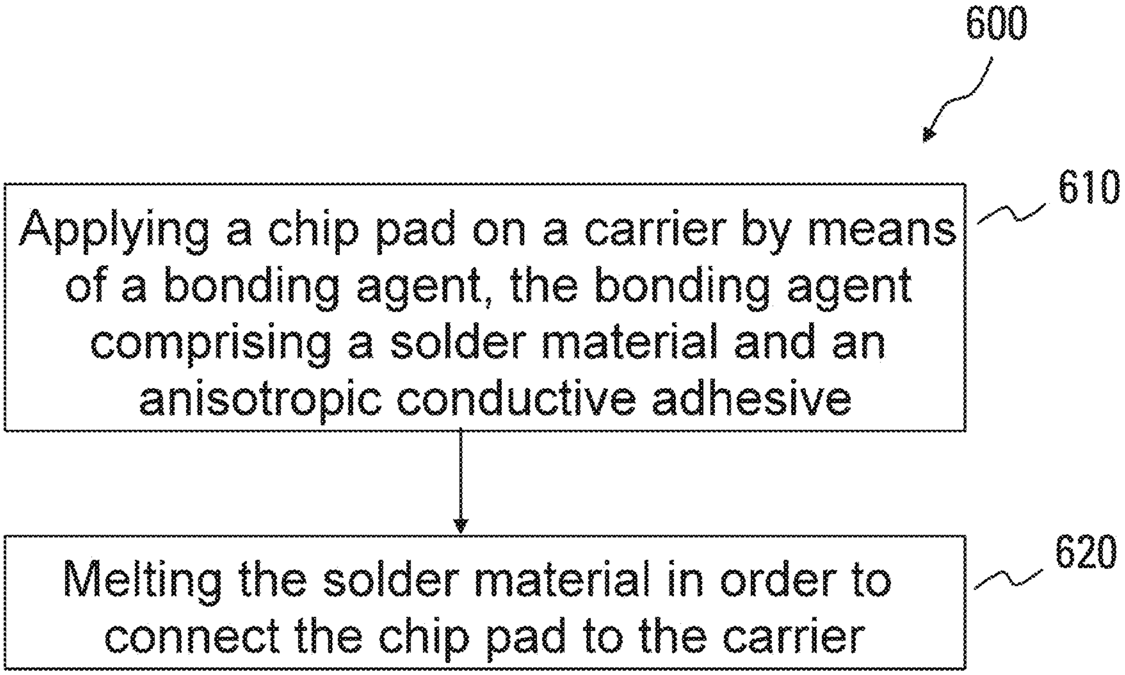
FIG. 6 shows a flowchart of a method for producing a chip arrangement according to various exemplary embodiments.

FIG. 6 is a flowchart 600 of a method for producing a chip arrangement according to various exemplary embodiments.

The method comprises applying a chip pad on a carrier by means of a bonding agent, the bonding agent comprising a solder material and an anisotropic conductive adhesive (610), and melting the solder material in order to connect the chip pad to the carrier (620).

Some exemplary embodiments will be summarized below.

Exemplary Embodiment 1 is a chip arrangement. The chip arrangement comprises a carrier, a chip having at least one chip pad, and a bonding agent for fastening the chip pad on the carrier, the bonding agent comprising solder material and an anisotropic conductive adhesive.

Exemplary Embodiment 2 is a chip arrangement according to Exemplary Embodiment 1, wherein the chip comprises a multiplicity of chip pads.

Exemplary Embodiment 3 is a chip arrangement according to Exemplary Embodiment 1 or 2, wherein the chip comprises at least four chip pads.

Exemplary Embodiment 4 is a chip arrangement according to one of Exemplary Embodiments 1 to 3, wherein the carrier is free of a solder stop structure and/or free of a flux.

Exemplary Embodiment 5 is a chip arrangement according to one of Exemplary Embodiments 1 to 4, wherein the anisotropic conductive adhesive comprises metal particles, the metal particles being made of a metal different than the metal of the solder material.

Exemplary Embodiment 6 is a chip arrangement according to one of Exemplary Embodiments 1 to 5, wherein the carrier comprises a metal on a carrier surface on which the at least one chip pad is fastened by means of the bonding agent.

Exemplary Embodiment 7 is a chip arrangement according to Exemplary Embodiment 6, wherein the metal of the carrier comprises at least one of a group of metals on its carrier surface, the group consisting of gold, palladium and Miralloy®.

Exemplary Embodiment 8 is a chip arrangement according to one of Exemplary Embodiments 1 to 7, wherein the melting point of the solder material lies in a temperature range for the curing of the anisotropic conductive adhesive.

Exemplary Embodiment 9 is a chip card. The chip card comprises a chip card body and a chip arrangement according to one of Exemplary Embodiments 1 to 8, which is arranged in or on the chip card body.

Exemplary Embodiment 10 is a method for producing a chip arrangement. The method comprises applying a chip pad on a carrier by means of a bonding agent, the bonding agent comprising a solder material and an anisotropic conductive adhesive, and melting the solder material in order to connect the chip pad to the carrier.

Exemplary Embodiment 11 is a method according to Exemplary Embodiment 10, wherein the application is carried out during the melting of the solder material with additional exertion of pressure.

Exemplary Embodiment 12 is a method according to Exemplary Embodiment 10 or 11, furthermore comprising arranging the anisotropic conductive adhesive on the carrier before the application of the chip pad.

Exemplary Embodiment 13 is a method according to one of Exemplary Embodiments 10 to 12, furthermore comprising arranging the solder material on the chip pad or arranging the solder material on the anisotropic conductive adhesive that is arranged on the carrier, before the application of the chip pad on the carrier.

Exemplary Embodiment 14 is a method according to one of Exemplary Embodiments 10 to 13, furthermore comprising curing the anisotropic conductive adhesive.

Exemplary Embodiment 15 is a method according to Exemplary Embodiment 14, wherein the melting point of the solder material lies in a temperature range for the curing of the anisotropic conductive adhesive, so that the melting of the solder material and the curing of the adhesive take place simultaneously.

Exemplary Embodiment 16 is a method according to one of Exemplary Embodiments 10 to 15, wherein the chip arrangement furthermore comprises a chip that comprises the chip pad.

Exemplary Embodiment 17 is a method according to Exemplary Embodiment 16, wherein the chip comprises a multiplicity of chip pads.

Exemplary Embodiment 18 is a method according to Exemplary Embodiment 16 or 17, wherein the chip comprises at least four chip pads.

Exemplary Embodiment 19 is a method according to one of Exemplary Embodiments 10 to 18, wherein the carrier is free of a solder stop structure and/or free of a flux.

Exemplary Embodiment 20 is a method according to Exemplary Embodiment 12, wherein the anisotropic conductive adhesive is applied surface-wide on the carrier.

Exemplary Embodiment 21 is a method according to one of Exemplary Embodiments 10 to 20, wherein the anisotropic conductive adhesive comprises metal particles, the metal particles being made of a metal different than the metal of the solder material.

Exemplary Embodiment 22 is a method according to one of Exemplary Embodiments 10 to 21, wherein the carrier comprises a metal on a carrier surface on which the at least one chip pad is fastened by means of the bonding agent.

Exemplary Embodiment 23 is a method according to Exemplary Embodiment 22, wherein the metal of the carrier comprises at least one of a group of metals on its carrier surface, the group consisting of gold, palladium and Miralloy®.

Exemplary Embodiment 24 is a method for producing a chip card, which comprises forming a chip arrangement by means of the method according to one of Exemplary Embodiments 10 to 23 and arranging the chip arrangement on or in the chip card body.

Further advantageous configurations of the device may be found from the description of the method, and vice versa.

The invention claimed is:

1. A method for producing a chip arrangement with a bonding agent comprising a solder material and an anisotropic conductive adhesive, the method comprising:

arranging the anisotropic conductive adhesive on a carrier;

arranging the solder material on a chip pad or on the anisotropic conductive adhesive;

applying the chip pad with the solder material on the anisotropic conductive adhesive or applying the chip pad to the anisotropic conductive adhesive with the solder material; and melting the solder material at a temperature within a curing temperature range of the anisotropic conductive adhesive, such that the melting of the solder material and curing of the anisotropic conductive adhesive occur simultaneously, to form an electrically conductive connection between the chip pad and the carrier.

2. The method of claim 1, wherein the application is carried out during the melting of the solder material with additional exertion of pressure.

3. The method of claim 1, further comprising:

curing the anisotropic conductive adhesive.

4. The method of claim 1, wherein the carrier is free of a solder stop structure or free of a flux.

5. The method of claim 1, wherein the anisotropic conductive adhesive is applied surface-wide on the carrier.

6. The method of claim 1, wherein the anisotropic conductive adhesive comprises metal particles made of a metal different than the metal of the solder material.

7. The method of claim 1, wherein the carrier comprises a metal on a carrier surface on which the chip pad is fastened using the adhesive.

8. A method for producing a chip card, comprising:

forming a chip arrangement using the method of claim 1; and arranging the chip arrangement on or in a chip card body.

* * * * *